United States Patent [19]
Andrews et al.

[11] Patent Number: 6,122,178
[45] Date of Patent: Sep. 19, 2000

[54] ELECTRONICS PACKAGE HAVING ELECTROMAGNETIC INTERFERENCE SHIELDING

[75] Inventors: Macdonald J. Andrews, East Douglas; Richard G. Berard, Chelmsford; Arnold E. VanDoren, Sterling, all of Mass.

[73] Assignee: Raytheon Company, Lexington, Mass.

[21] Appl. No.: 08/978,237

[22] Filed: Nov. 25, 1997

[51] Int. Cl.[7] .................................................. H05K 7/14
[52] U.S. Cl. ..................... 361/800; 361/736; 361/737; 361/750; 361/752; 361/760; 361/765; 361/799; 361/800; 361/801; 361/802; 361/816; 361/818
[58] Field of Search ............................ 361/748, 750, 361/751, 752, 756, 760–765, 816, 818, 800, 744, 736–737, 801, 802

[56] References Cited

U.S. PATENT DOCUMENTS

| | | | |
|---|---|---|---|
| 4,803,306 | 2/1989 | Malmquist | 174/35 |
| 4,890,199 | 12/1989 | Beutler | 361/424 |
| 5,053,924 | 10/1991 | Kurgan | 361/424 |
| 5,124,889 | 6/1992 | Humbert et al. | 361/424 |
| 5,164,543 | 11/1992 | Benson et al. | 174/35 |
| 5,313,016 | 5/1994 | Brusati et al. | 174/35 |
| 5,354,951 | 10/1994 | Lange, Sr. et al. | 174/35 R |
| 5,436,802 | 7/1995 | Trahan et al. | 361/816 |
| 5,572,408 | 11/1996 | Anhalt et al. | 361/737 |
| 5,594,204 | 1/1997 | Taylor et al. | 174/52.2 |
| 5,726,867 | 3/1998 | Zarreii | 361/818 |
| 5,748,455 | 5/1998 | Phillips et al. | 361/818 |
| 5,805,429 | 9/1998 | Anderson | 361/799 |
| 5,946,194 | 8/1999 | Dulas et al. | 361/737 |

*Primary Examiner*—Hyung-Sub Sough
*Assistant Examiner*—Tuan Dinh
*Attorney, Agent, or Firm*—Fish & Richardson P.C.

[57] ABSTRACT

A PCMCIA electronics package adapted to enclose, and provides EMI shielding to, a printed circuit board (PCB). The PCB has an electrical connector adapted for plugging into a computer is at a one end and RF circuitry at the other end. Electronic components are disposed on an inner region of the surfaces of the PCB. The PCB has a ground plane conductor disposed therein. Electrically conductive strips are disposed on the surfaces of the PCB along opposing side edges and the other end of the PCB. A plurality of conductive vias pass through a portion of the PCB electrically connecting the electrical strip conductors to the ground plane conductor. A plurality of resilient, electrically conductive clips is provided. Each one of the clips has: a cup-shaped region disposed over a corresponding one of the PCB edges and the other end of the PCB. Side portions of the cup-shaped regions are in contact with conductive strips. The clips have an arm with a distal end elevated from the PCB. The package includes a pair of electrically conductive covers disposed over the PCB and in contact with the distal ends of the arms. Each clip is elongated and has an array of slots disposed in the distal end of the arm. The arm has a intermediate portion adjacent to the edge of the printed circuit board and the distal end of the arm curves outwardly from the intermediate portion of the arm.

50 Claims, 6 Drawing Sheets

ELECTRONICS PACKAGE HAVING ELECTROMAGNETIC INTERFERENCE SHIELDING

BACKGROUND OF THE INVENTION

This invention relates generally to electronics packages and more particularly to electronics packages having electromagnetic interference (EMI) shielding.

As is known in the art, electronics packages have a wide range of applications. One such application is in Personal Computer Memory Card Interface Association (PCMCIA) units. Products conforming to the PCMCIA specifications are required to fit into one of five standard housings. These standard housings configurations provide for adequate EMI shielding of low frequency circuits which they were intended to enclose. Recently, however, some manufactures have taken advantage of the PCMCIA interface to introduce the concept of wireless networking. The Federal Communications Commission (FCC) has provided radio frequency (RF) bands at 900 MHz and 2.4 GHz for this application. One type of electronics package for this application is a PCMCIA Type II Extended housing. Such housing poses serious challenges for EMI shielding of PCMCIA housings to meet the requirements of FCC Regulations, Part 15 Class B.

SUMMARY OF THE INVENTION

In accordance with the present invention, a package is provided for a printed circuit board. An electrically conductive strip is disposed along an edge of the printed circuit board. A resilient, electrically conductive clip is provided. The clip has a cup-shaped region disposed over the edge of the printed circuit board. A side portion of the cup-shaped region is in contact with the conductive strip. The clip has an arm. A distal end of the arm is elevated from the surface of the printed circuit board. An electrically conductive cover is disposed over the printed circuit board and in contact with the distal end of the arm.

In a one embodiment, the clip is a single-piece.

In accordance with another feature of the invention, the clip is elongated and has an array of slots disposed in the distal end of the arm. The arm has a intermediate portion between the distal and proximal ends thereof. The distal end of the arm curves outwardly from the intermediate portion of the arm and is arch-shaped. The slots have a separation one from another of $\lambda/4$, where $\lambda$ is the wavelength of the highest operating frequency on the printed circuit board to be shielded.

In accordance with another feature of the invention, a PCMCIA package is provided. The package encloses, and provides EMI shielding to, a printed circuit board having: an electrical connector adapted for plugging into a computer at one end portion of the printed circuit board; radio frequency circuitry at the other end of the printed circuit board; and a ground plane conductor. An electronic component is disposed on an inner region of a surface of the printed circuit board. An electrically conductive strip is disposed along opposing side edges and said other end of the printed circuit board. A conductive via passes through a portion of the printed circuit board electrically connecting the electrical strip conductor to the ground plane conductor. A plurality of resilient, electrically conductive clips is provided. Each one of the clips has: a cup-shaped region disposed over a corresponding one of the edges and said other end of the printed circuit board, a side portion of the cup-shaped region being in contact with the corresponding conductive strip, and an arm having a distal end elevated from said printed circuit board. A first electrical connective cover is disposed over said surface of the printed circuit board and over the electrical component disposed on said surface. The first electrically conductive cover is in contact with the distal ends of the arms.

In accordance with still another feature of the invention, the PCMCIA package includes a second strip conductor disposed on an outer edge portion of a second surface of the printed circuit board. The ground plane conductor is disposed in the printed circuit board between the first-mention surface and the second surface. A second electrically conductive via electrically passes through a portion of the printed circuit board to connect the ground plane conductor to the second strip conductor. The second side portion of the cup-shaped region is in contact with the second strip conductor. Each one of the clips includes a second arm. The second arm has: a distal end elevated from said second surface of the printed circuit board when the clip is clipped onto the outer edge of the printed circuit board; and a proximal end disposed at the cup-shaped region. The proximal end of the first-mentioned arm is disposed at the first side portion of the cup-shaped region and the proximal end of the second arm is disposed at the second side portion of the cup-shaped region.

In a one embodiment, a second electrical component is disposed on the second surface of the printed circuit board. The second electrically conductive cover is disposed over said second surface of the printed circuit board and over the second electrical component disposed on said second surface. The second electrically conductive is in contact with the distal end of the second arm. The clip is elongated having an array of slots disposed in the distal end of the arm. The arm has a intermediate portion adjacent to the edge of the printed circuit board and the distal end of the arm curves outwardly from the intermediate portion of the arm. One of the covers has an edge portion thereof disposed in a dielectric. The slots have a separation one from another of $\lambda/4$, where $\lambda$ is the wavelength of the highest operating frequency on the printed circuit board to be shielded.

BRIEF DESCRIPTION OF THE DRAWING

Other features of the invention, as well as the invention itself, will become more readily apparent from the following detailed description taken together with the accompanying drawings, in which:

FIG. 4 is a perspective view of a printed circuit board used in the PCMCIA wireless unit of FIG. 1;

FIG. 5 is a perspective view of a printed circuit board used in the PCMCIA wireless unit of FIG. 1 and a plurality of clips mounted to edges of the printed circuit board;

DESCRIPTION OF THE PREFERRED EMBODIMENTS

Figure 1:
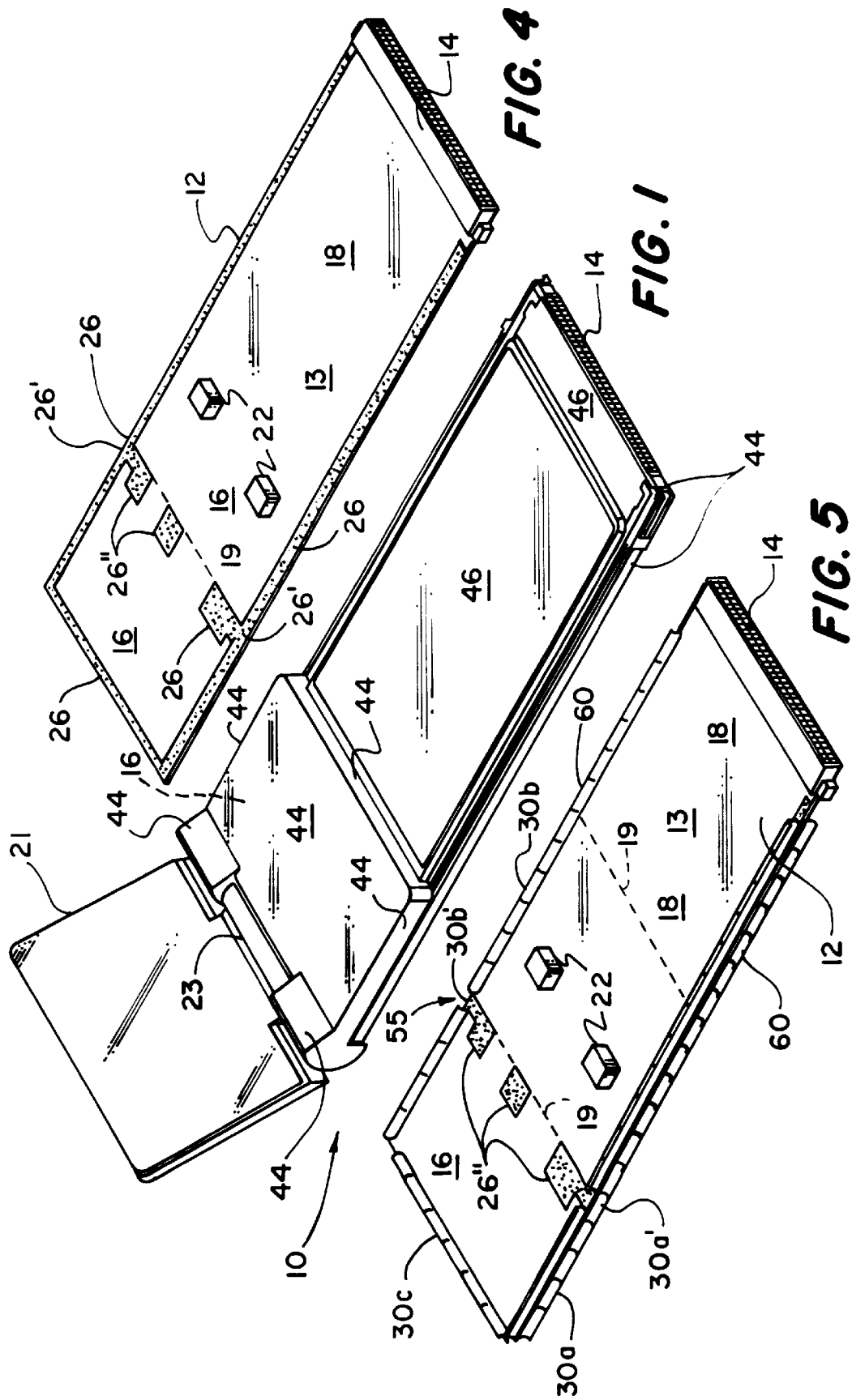
FIG. 1 is a perspective view of an electronics package, here a PCMCIA wireless unit, according to the invention.
Figure 2:
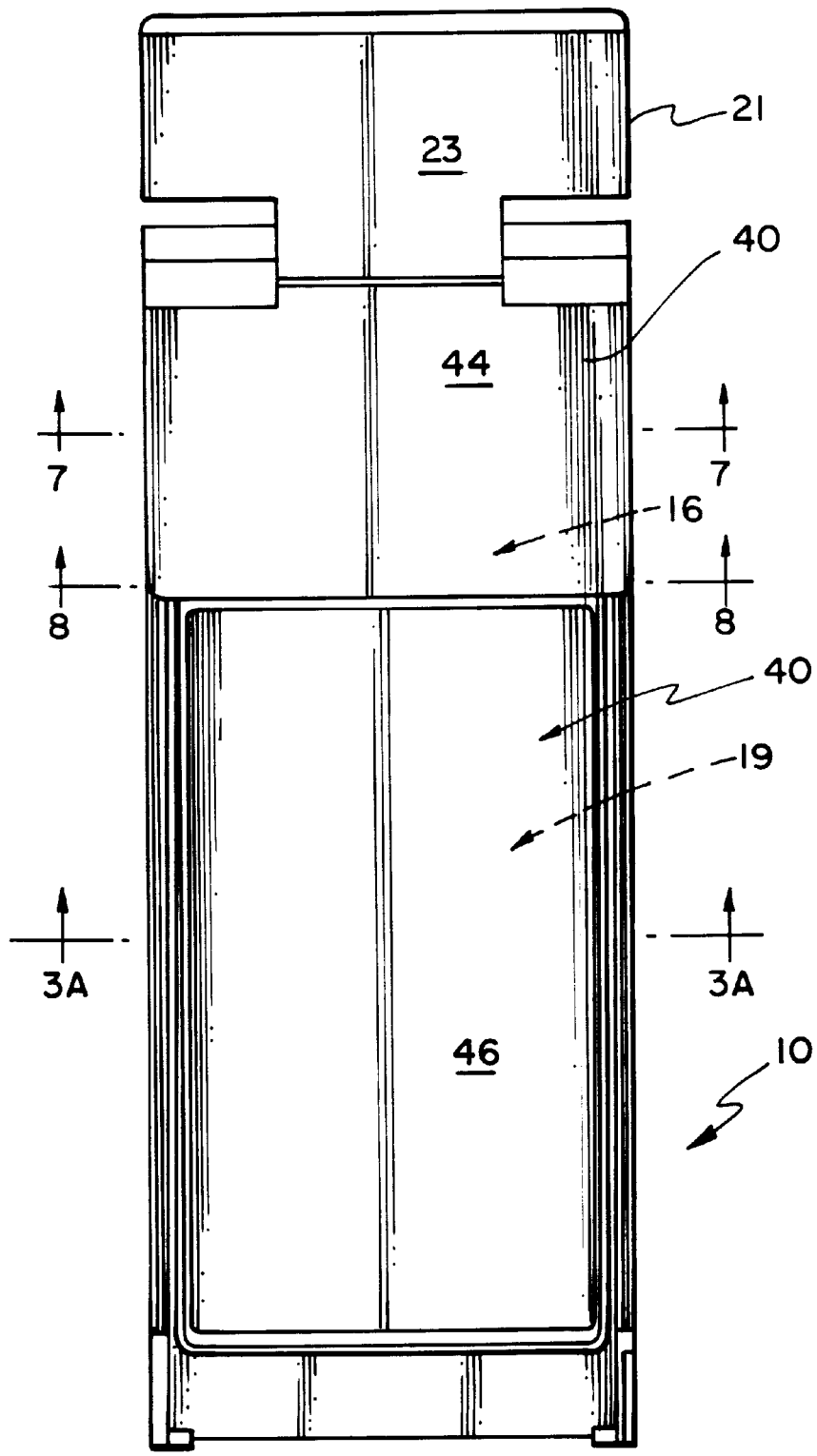
FIG. 2 is a plan view of the PCMCIA wireless unit of FIG. 1.

Referring now to FIG. 1 an electronics package 10 is shown, here a PCMCIA wireless unit. The unit is adapted for plugging into a personal computer, not shown, to enable communication between the personal computer and a Wireless Local Area Network (Wireless LAN), for example, not shown. The package 10 provides EMI shielding for the electronics disposed therein. More particularly, the package 10 encloses a printed circuit board (PCB) 12, shown more clearly in FIGS. 4, and 3A. The PCB 12 has an electrical connector 14 and relatively low frequency components, i.e., digital interfaces and power conditioning circuitry and A/D and D/A converters, not shown, at the rear end portion 13 thereof. The connector 14 is adapted for plugging into the personal computer, not shown. The front end portion 16 of the printed circuit board 12 has mounted to the upper and lower surfaces 18, 20 (FIGS. 3 and 3A) thereof, radio frequency circuitry and components 22. (Dotted line 19 indicates the approximate border between the low frequency components in rear portion 13 and the higher (RF) frequency components in the front end portion 16). The package 10 includes an antenna section 21 coupled to the radio frequency components by cables, not shown, which pass from antenna section 21 to the front end portion 16 through a hinge 23.

Figure 3:
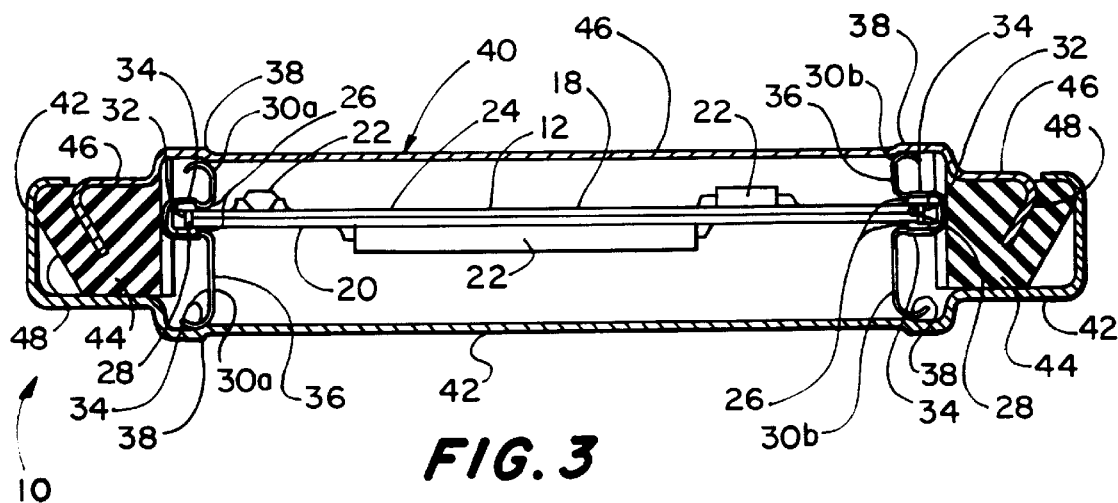
FIG. 3 is a cross-sectional view of the PCMCIA wireless unit of FIG. 1, such cross-section being taken along line 3—3 in FIG. 2.
Figure 3A:
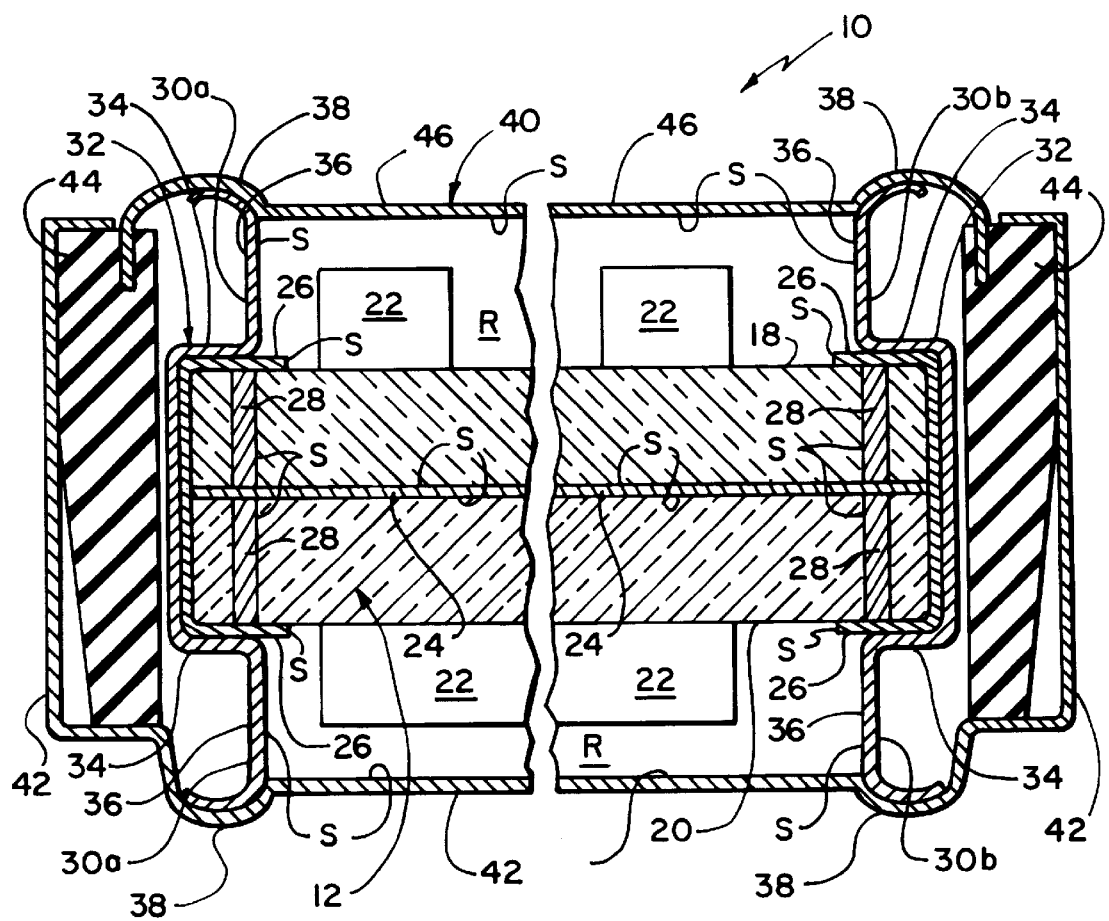
FIG. 3A is a diagrammatical cross-sectional view of the PCMCIA wireless unit of FIG. 1.
Figure 7:
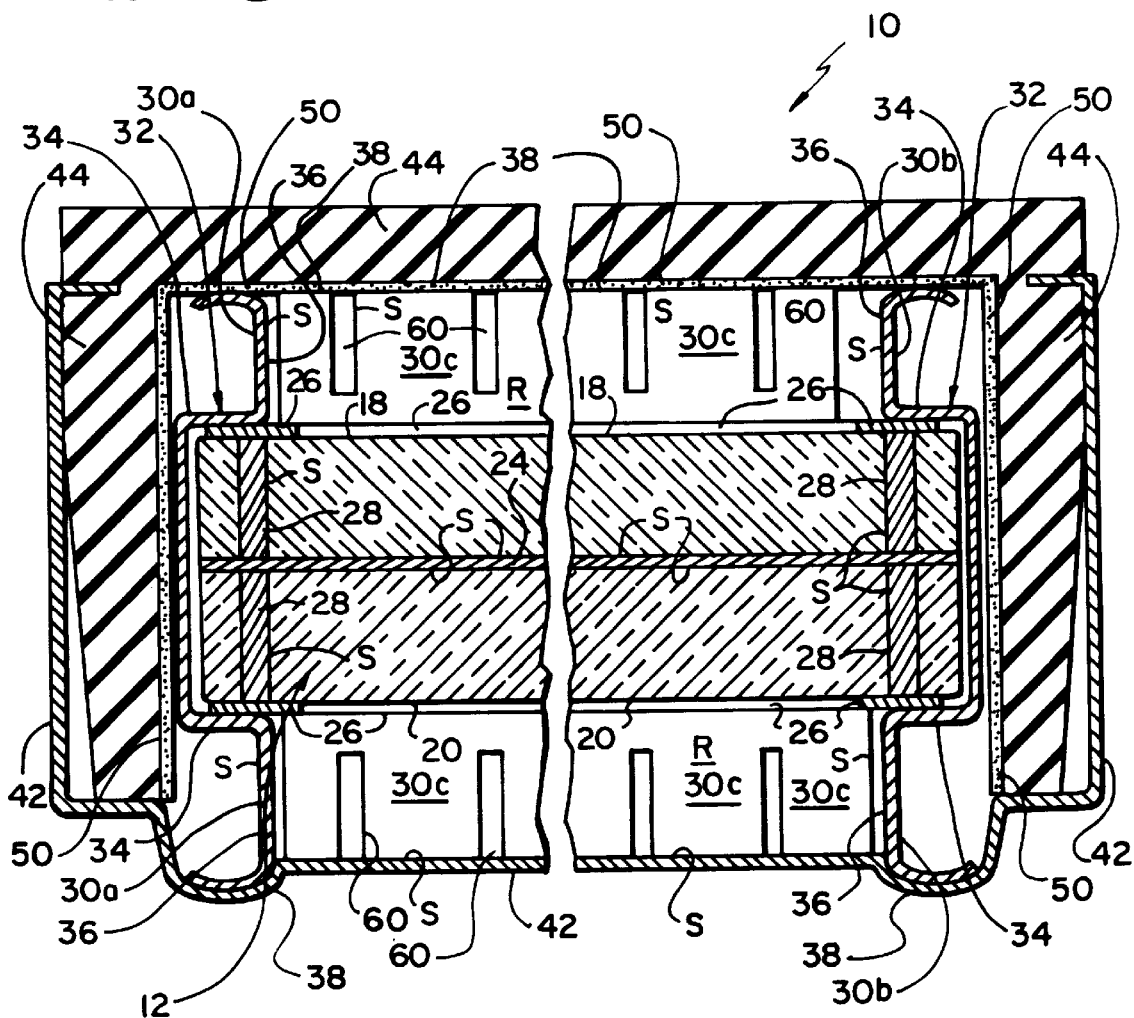
FIG. 7 is a diagrammatical cross-sectional view of the PCMCIA wireless unit of FIG. 1, such cross-section being taken along line 7—7 in FIG. 2.

Here, the PCB 12 is a multi-level PCB and has a ground plane conductor 24 disposed therein between the upper and lower surfaces 18, 20 as shown more clearly in FIGS. 3 and 3A. It is noted that the electronic components 22 are disposed on an inner region of the surfaces 18, 20 of the printed circuit board 12. An electrically conductive strip 26 is disposed along opposing side edges and the front end of the upper and lower surfaces 18, 20 of the printed circuit board 12, as shown in FIGS. 3, 3A, 7. A plurality of conductive vias 28 (FIGS. 3, 3A) are disposed along the length of the strip 26. Each conductive via 28 passes through a portion of the printed circuit board 12 electrically connecting the conductive strip 26 to the ground plane conductor 24, as shown in detail in FIG. 3 and 3A.

Figure 6:
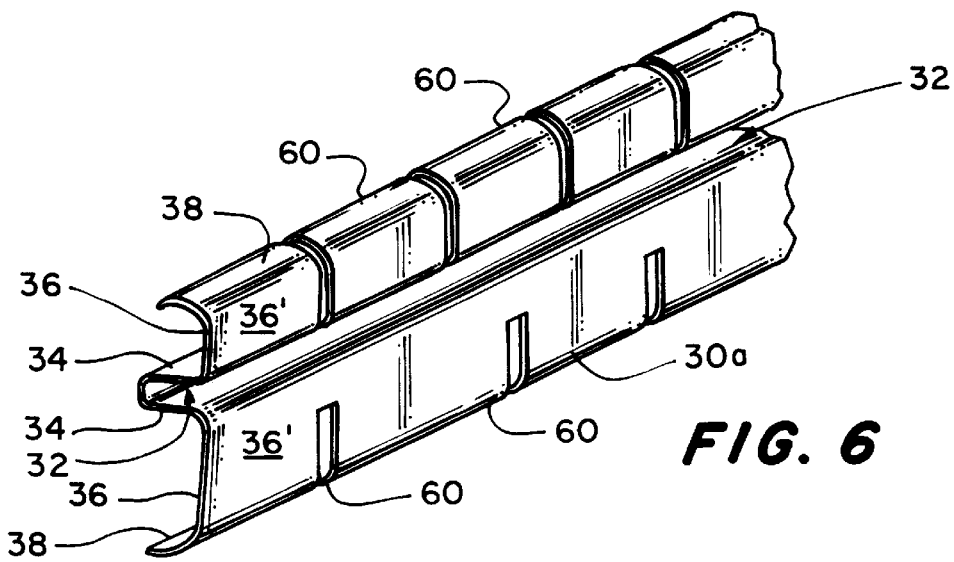
FIG. 6 is a perspective view, partially broken away, of an exemplary one of the clips shown in FIG. 5.

A plurality of, here three, resilient, electrically conductive, single-piece, clips 30a, 30b and 30c are attached to the side edges and the front edge of the PCB 12, respectively, as shown in FIG. 5. Each one of the clips 30a, 30b, 30c is substantially identical, an exemplary one thereof, here clip 30a being shown in perspective FIG. 6. Each one of the clips 30a, 30b, 30c has a cup-shaped region 32 over (i.e., clipped onto), a corresponding one of the side edges and front edge of the PCB 12, as indicated in FIGS. 3, 3A. The side portions 34 of the cup-shaped region 32 are in physical, and electrical contact with the conductive strips 26. Each clip 30a, 30b, 30c has a pair of vertically extending arms 36. Each arm 36 has a distal end 38 elevated from the surfaces 18, 20 of the PCB 12, as indicated in FIG. 3A.

Figure 9:
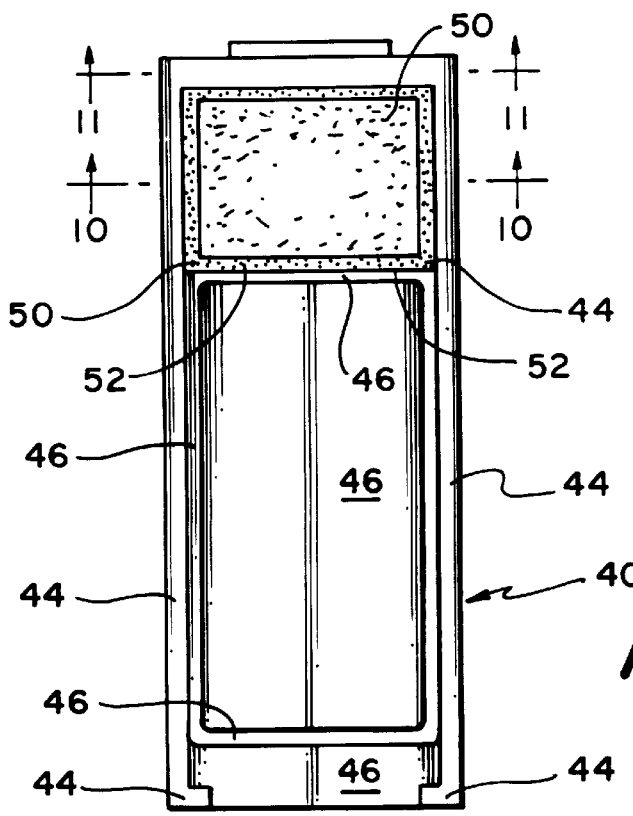
FIG. 9 is a plan view of the inner surface of an upper cover used in the unit of FIG. 1.
Figure 10:
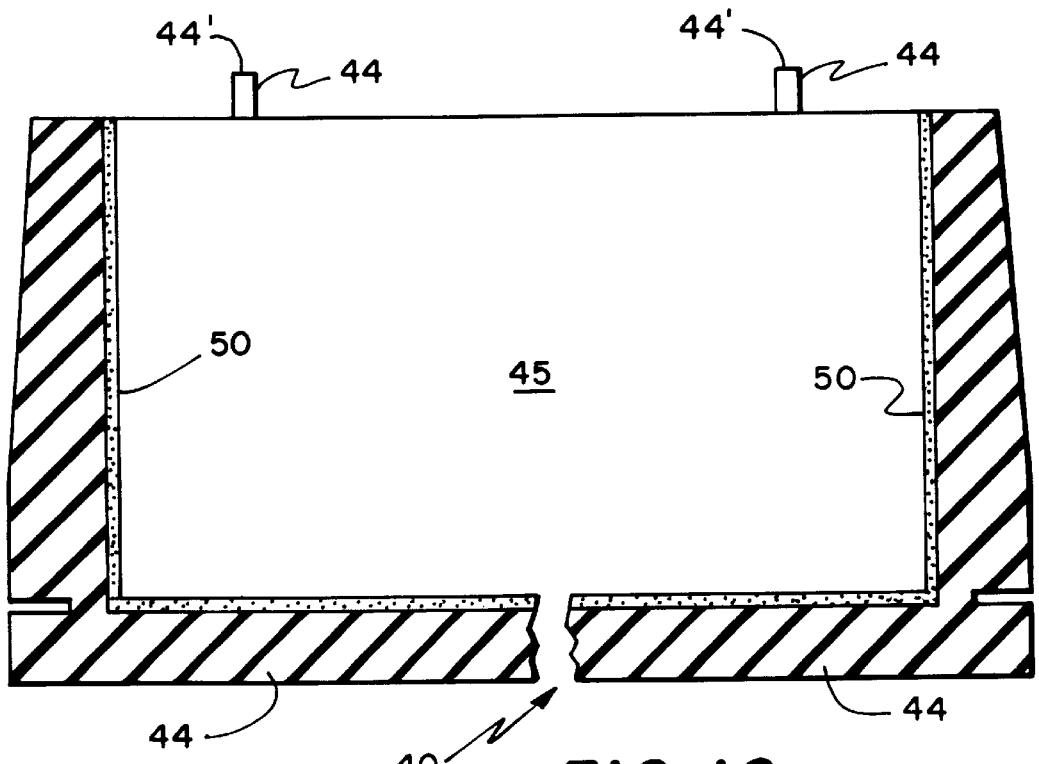
FIG. 10 is a diagrammatical cross-sectional view of the upper cover of FIG. 9, the cross-section of the upper cover being taken along line 10—10 in FIG. 9.

The package 10 has upper and lower covers 40, 42. The lower cover 42 is an electrically conductive plate, here 0.008 inch stainless steel. The upper cover 40, shown also in FIGS. 3, 3A, 9, 10 and 11, is made up of a dielectric, here plastic, (more particularly, acrylonitrile butadiene styrene (ABS)/ Polycarbonate thermoplastic portion 44 and an electrically conductive plate 46, here 0.008 inch stainless steel, having ends 48 thereof transfer molded into the plastic portion 44, as indicated in FIGS. 3 and 3A. The front under-side of the front portion of the plastic portion 44 provides a compartment 45 (FIGS. 9 and 10) for the radio frequency circuitry in front end portion 16, described above. The sides and bottom (i.e., inner-surface of the compartment 45 are coated with an electrically conductive material 50, here indicated by stippling). A portion of the electrically conductive coating material 50 is disposed on the front edge portion of the electrically conductive plate 46. Thus, the electrically conductive coating material 50 and the electrically conductive plate 46 provide an upper conductive cover 40 (FIGS. 3 and 3A) for the package 10. It is noted that the compartment 45 is divided from the conductive plate 46 by an bar 52 molded in the plastic portion 44. The top and side surfaces of the bar 52 are also coated with an electrically conductive material 50, as indicated in FIGS. 9 and 10.

Figure 8:
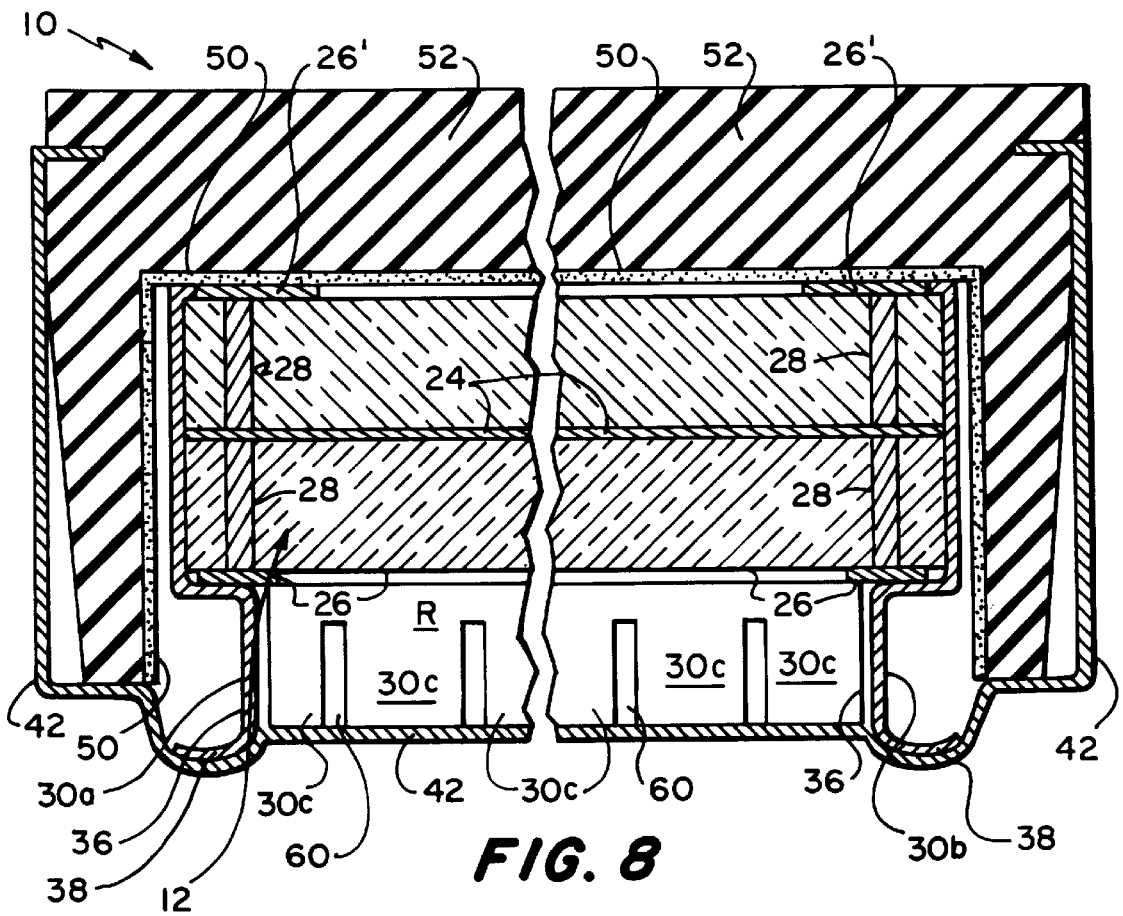
FIG. 8 is a diagrammatical cross-sectional view of the PCMCIA wireless unit of FIG. 1, such cross-section being taken along line 8—8 in FIG. 2.

When assembled with the upper and lower covers 40, 42 clipped together, as shown in FIGS. 1, 3, 3A, 7, and 8, the electrically conductive cover 40 is disposed over surface 18 of the printed circuit board 12 and over the electrical components 22 disposed on surface 18. The electrically conductive cover 40 is in contact with the distal ends 38 of the clips 30a, 30b and 30c. It is noted that the bar 52 passes into slots 55 (FIG. 5, provided in clips 30a and 30b). Thus, as shown in FIG. 8, the electrically conductive coating 50 on the bar 52 is in physical, and therefore electrical contact with the portions 26' of the conductive strips 26 exposed by the slots 55, including pads 26" which are also connected to the ground plane conductor 24 via electrically conductive vias.

It is noted that the clips 30a, 30b and 30c are elongated and have an array of slots 60 (FIG. 6) disposed in the distal end 38 of the arm 36. The slots are provided to enable the clips 30a, 30b and 30c to conform to any irregularities in the surface they are to physically contact, i.e, the conductive strip 26 or the upper and lower covers 40, 42, or the coating 50. The slots 60 have a separation one from another of $\lambda/4$, where $\lambda$ is the wavelength of the highest operating frequency of the RF circuitry to be shielded. It is also noted that the arm 36 has a intermediate portion 36' (FIG. 6) and that the distal end 38 curves outwardly, i.e., is arch-shaped, from the intermediate portion 36'. Here, the clips 30a, 30b and 30c are nickel plated beryllium-copper material, here having a thickness of 0.003 inches. The overall height of the clip is approximately 0.20 inches. They provide a nearly continuous ground plane conductor connection around the inner portions of the PCB 12. Thus, referring to FIG. 3A, EMI shields, S, are formed around the inner regions, R, of the PCB 12. Similar shielded regions R are shown in FIGS. 7 and 8. Thus, the shielding method approximates a fully conductive surface around the circuitry (i.e., around regions, R) on both sides of the PCB 12. It is noted that while a clip is not disposed along the rear portion of the PCB 12 (FIG. 5) clips 30a and 30b, together with the covers 40, 42 and PCB ground plane 24 provide a rectangular waveguides which extends from the front of the PCB 12 to the rear of the PCB 12. The waveguides are, at the operating frequencies below about 3.5 GHz, below cut-off and therefore any RF energy which would tend to propagate to the connector 14 would be substantially attenuated. Further, contact pads, not shown, to which the connector 14 electrical pins, not shown, are connected provide, with the ground plane conductor 12, a capacitance which shorts the RF to ground. Additionally, connector 14 electrical pins, not shown, provide a reflective interfering structure to incident RF signals.

Figure 11:
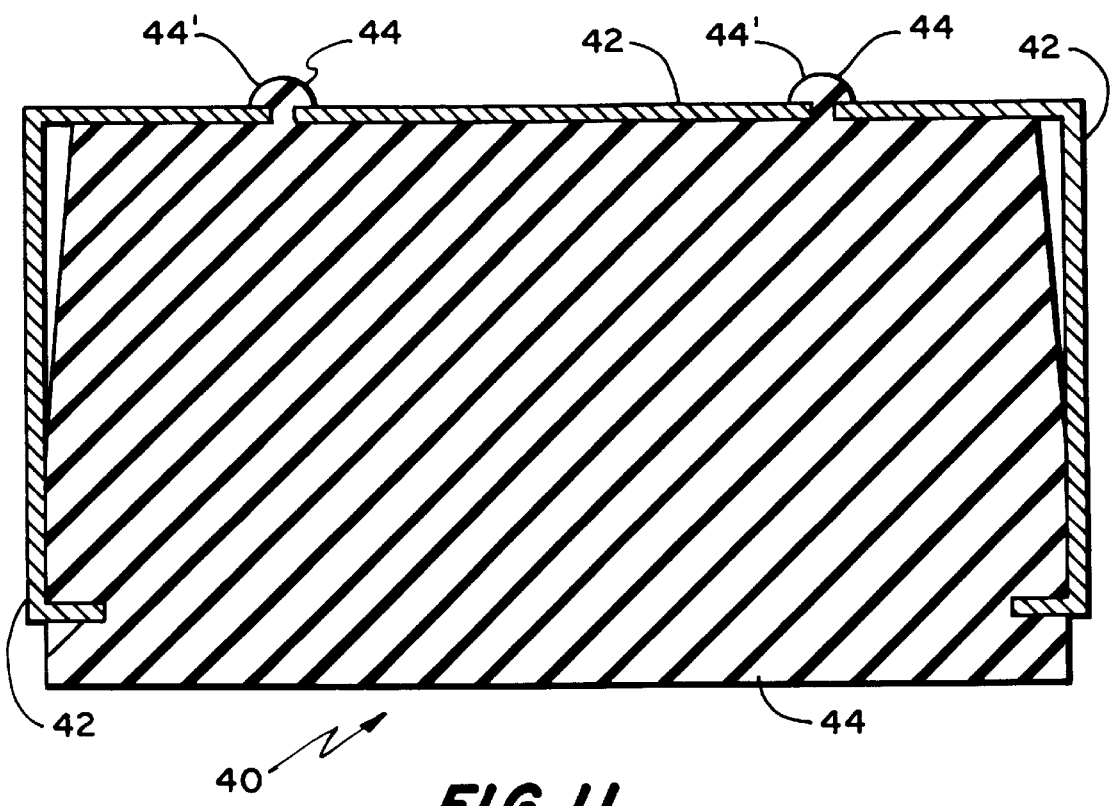
FIG. 11 is a diagrammatical cross-sectional view of the upper cover and a bottom cover used in the unit of FIG. 1, such cross-section being taken along line 11—11 in FIG. 9.

Referring to FIGS. 9, 10 and 11, it is noted that a pair of plastic posts 44' are formed in the plastic material 44. After the lower cover 42 is snapped onto the upper cover 40, the posts 44' are peened over as rivets to hold down the end of the lower cover 42. Thus, the posts 44' provide rivets in order to hold down and maintain the lower cover 42 in contact with the distal end of the clip 30c.

The overall length of the package 10 is here approximately 5 and one half inches, the overall width is approximately 2 and one eight inch and the approximate length of front end portion 16 is one inch.

Other embodiments are within the spirit and scope of the appended claims. For example, when the PCB 12 has a ground plane conductor on an other surface thereto, a clip having only one arm may be used. Further, while the distal ends 38 extend outwardly away from the PCB 12 they may extend inwardly to towards the PCB

What is claimed is:

1. A package, comprising:
   (a) a printed circuit board;
   (b) an electrically conductive strip disposed along an edge of the printed circuit board;
   (c) a resilient, electrically conductive clip having:
      (i) a cup-shaped region disposed over the edge of the printed circuit board, a side portion of the cup-shaped region being in contact with the conductive strip, and
      (ii) an arm having a distal end elevated from said printed circuit board; and
   (d) an electrically conductive cover disposed over the printed circuit board and in contact with the distal end of the arm.

2. The package recited in claim 1 wherein the clip is a single-piece.

3. The package recited in claim 2 wherein the clip is elongated having an array of slots disposed in the arm.

4. The package recited in claim 3 wherein the clip is elongated having an array of slots disposed in the distal end of the arm.

5. The package recited in claim 4 wherein the arm has a intermediate portion between the distal and proximal ends thereof.

6. The package recited in claim 5 wherein the distal end of the arm curves outwardly from the intermediate portion of the arm.

7. The package recited in claim 6 wherein the clip is elongated having an array of slots disposed in the arm.

8. The package recited in claim 7 wherein the clip is elongated having an array of slots disposed in the distal end of the arm.

9. The package recited in claim 8 wherein the distal end of the arm is arch-shaped.

10. The package recited in claim 7 wherein the slots have a separation one from another of λ/4, where λ is the wavelength of the highest operating frequency on the printed circuit board to be shielded.

11. A package, adapted to provide electromagnetic shielding to an electronic circuit disposed in such package, comprising:
    (A) a printed circuit board having a ground plane conductor;
    (B) an electronic component disposed on a inner region of a surface of the printed circuit board;
    (C) an electrically conductive strip disposed along an outer edge portion of said surface of the printed circuit board;
    (D) a conductive via passing through a portion of the printed circuit board electrically connecting the electrically conductive strip to the ground plane conductor;
    (E) a resilient, electrically conductive clip having:
       (i) a cup-shaped region adapted to clip onto the outer edge portion of the printed circuit board, a first side portion of the cup-shaped region being in contact with the conductive strip and a second side portion of the cup-shaped region being electrically connected to the ground plane conductor; and
       (ii) an arm having:
          (a) a distal end elevated from said surface of the printed circuit board when the clip is on the outer edge of the printed circuit board; and
          (b) a proximal end disposed at the cup-shaped region;
    (F) a first electrically conductive cover disposed over said surface of the printed circuit board and over the electrical component disposed on said surface, such first electrically conductive cover being in contact with the distal end of the arm; and
    (G) a second electrically conductive cover disposed over one surface of, and electrically connected to, the ground plane conductor.

12. The package recited in claim 11 wherein the clip is a single-piece.

13. The package recited in claim 11 including a second strip conductor disposed on an outer edge portion of a second surface of the printed circuit board; and
    wherein the ground plane conductor is disposed in the printed circuit board between the first-mention surface and the second surface;
    a second electrically conductive via electrically passing through a portion of the printed circuit board to connect the ground plane conductor to the second strip conductor; and
    wherein the second side portion is in contact with the second strip conductor.

14. The package recited in claim 13 wherein the clip includes a second arm having:
    a distal end elevated from said second surface of the printed circuit board when the clip is clipped onto the outer edge of the printed circuit board; and
    a proximal end disposed at the cup-shaped region.

15. The package recited in claim 14 wherein the proximal end of the first-mentioned arm is disposed at the first side portion of the cup-shaped region and the proximal end of the second arm is disposed at the second side portion of the cup-shaped region.

16. The package recited in claim 15 wherein the clip is a single-piece.

17. The package recited in claim 15 including a first electrical component disposed on the first surface of the printed circuit board and wherein the first electrically conductive cover is disposed over said first surface of the printed circuit board and over the first electrical component disposed on said first surface, such first electrically conductive cover being in contact with the distal end of the first arm.

18. The package recited in claim 17 including a second electrical component disposed on the second surface of the printed circuit board and wherein a second electrically conductive cover is disposed over said second surface of the printed circuit board and over the second electrical component disposed on said second surface, such second electrically conductive cover being in contact with the distal end of the second arm.

19. The package recited in claim 18 wherein the clip is elongated having an array of slots disposed in the arm.

20. The package recited in claim 18 wherein the clip is elongated having an array of slots disposed in the distal end of the arm.

21. The package recited in claim 18 wherein the arm has a intermediate portion adjacent to the edge of the printed circuit board.

22. The package recited in claim 21 wherein the distal end of the arm curves outwardly from the intermediate portion of the arm.

23. The package recited in claim 22 wherein the clip is elongated having an array of slots disposed in the arm.

24. The package recited in claim 23 wherein the clip is elongated having an array of slots disposed in the distal end of the arm.

25. A PCMCIA package, comprising:
   (a) a printed circuit board having an electrical connector adapted for plugging into a computer at one end portion of the printed circuit board and radio frequency circuitry at the other end of the printed circuit board;
   (b) an electrically conductive strip disposed along opposing side edges and said other end of the printed circuit board;
   (c) a plurality of resilient, electrically conductive clips, each one thereof having:
      (i) a cup-shaped region disposed over a corresponding one of the edges and said other end of the printed circuit board, a side portion of the cup-shaped region being in contact with the corresponding conductive strip, and
      (ii) an arm having a distal end elevated from said printed circuit board; and
   (d) an electrically conductive cover disposed over the printed circuit board and in contact with the distal end of the arm.

26. The package recited in claim 25 wherein each one of the clips is a single-piece.

27. The package recited in claim 26 wherein each one of the clips is elongated having an array of slots disposed in the arm.

28. The package recited in claim 27 wherein each one of the clips is elongated having an array of slots disposed in the distal end of the arm.

29. The package recited in claim 28 wherein the arm has a intermediate portion adjacent to the edge of the printed circuit board.

30. The package recited in claim 29 wherein the distal end of the arm curves outwardly from the intermediate portion of the arm.

31. A PCMCIA package, comprising:
   (a) a printed circuit board having:
      (i) an electrical connector adapted for plugging into a computer at one end portion of the printed circuit board;
      (ii) radio frequency circuitry at the other end of the printed circuit board; and
      (iii) a ground plane conductor;
   (b) an electronic component disposed on an inner region of a surface of the printed circuit board;
   (c) an electrically conductive strip disposed along opposing side edges of the printed circuit board and along said other end of the printed circuit board;
   (d) a conductive via passing through a portion of the printed circuit board electrically connecting the electrical strip conductor to the ground plane conductor;
   (e) a plurality of resilient, electrically conductive clips, each one thereof having:
      (i) a cup-shaped region disposed over a corresponding one of the edges and said other end of the printed circuit board, a side portion of the cup-shaped region being in contact with the corresponding conductive strip, and
      (ii) an arm having a distal end elevated from said printed circuit board; and
   (f) a first electrically conductive cover disposed over said surface of the printed circuit board and over the electrical component disposed on said surface, such first electrically conductive cover being in contact with the distal ends of the arms; and
   (g) a second electrically conductive cover disposed over one surface of, and electrically connected to the ground plane conductor.

32. The package recited in claim 31 wherein each one of the clips is a single-piece.

33. The package recited in claim 31 including:
   (a) a second strip conductor disposed on an outer edge portion of a second surface of the printed circuit board; and
      wherein the ground plane conductor is disposed in the printed circuit board between the first-mention surface and the second surface;
   (b) a second electrically conductive via electrically passing through a portion of the printed circuit board to connect the ground plane conductor to the second strip conductor; and
      wherein the second side portion of the cup-shaped region is in contact with the second strip conductor.

34. The package recited in claim 33 wherein each one of the clips includes a second arm having:
   a distal end elevated from said second surface of the printed circuit board when the clip is clipped onto the outer edge of the printed circuit board; and
   a proximal end disposed at the cup-shaped region.

35. The package recited in claim 34 wherein the proximal end of the first-mentioned arm is disposed at the first side portion of the cup-shaped region and the proximal end of the second arm is disposed at the second side portion of the cup-shaped region.

36. The package recited in claim 35 wherein each one of the clips is a single-piece.

37. The package recited in claim 35 including a first electrical component disposed on the first surface of the printed circuit board and wherein the first electrically conductive cover is disposed over said first surface of the printed circuit board and over the first electrical component disposed on said first surface, such first electrically conductive cover being in contact with the distal end of the first arm.

38. The package recited in claim 37 including a second electrical component disposed on the second surface of the printed circuit board and wherein the second electrically conductive cover is disposed over said second surface of the printed circuit board and over the second electrical component disposed on said second surface, such second electrically conductive cover being in contact with the distal end of the second arm.

39. The package recited in claim 38 wherein the clip is elongated having an array of slots disposed in the arm.

40. The package recited in claim 38 wherein the clip is elongated having an array of slots disposed in the distal end of the arm.

41. The package recited in claim 38 wherein the arm has a intermediate portion adjacent to the edge of the printed circuit board.

42. The package recited in claim 41 wherein the distal end of the arm curves outwardly from the intermediate portion of the arm.

43. The package recited in claim 42 wherein the clip is elongated having an array of slots disposed in the arm.

44. The package recited in claim 43 wherein the clip is elongated having an array of slots disposed in the distal end of the arm.

45. The package recited in claim 31 wherein one of the covers has an edge portion thereof disposed in a dielectric.

46. The package recited in claim 43 wherein the slots have a separation one from another of $\lambda/4$, where $\lambda$ is the wavelength of the highest operating frequency on the printed circuit board to be shielded.

47. The package recited in claim 1 including a conductive plate disposed under the printed circuit board, such second surface being in contact with the clip.

48. The package recited in claim 47 wherein the arm of the clip is elevated from one surface of the printed circuit board and wherein such clip includes a second arm having a distal end elevated from an opposite surface of said printed circuit board and wherein the conductive plate is in contact with the second arm.

49. The package recited in claim 47 wherein the conductive plate is a ground plane conductor disposed on the printed circuit board.

50. The package recited in claim 49 wherein the electrically conductive strip is connected to the ground plane conductor by a conductive via passing through the printed circuit board.

* * * * *